United States Patent
Lin et al.

(10) Patent No.: US 11,860,228 B2
(45) Date of Patent: Jan. 2, 2024

(54) INTEGRATED CIRCUIT CHIP TESTING INTERFACE WITH REDUCED SIGNAL WIRES

(71) Applicant: XILINX, INC., San Jose, CA (US)

(72) Inventors: Albert Shih-Huai Lin, Mountain View, CA (US); Niravkumar Patel, San Jose, CA (US); Amitava Majumdar, San Jose, CA (US); Jane Wang Sowards, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/742,363

(22) Filed: May 11, 2022

(65) Prior Publication Data

US 2023/0366929 A1 Nov. 16, 2023

(51) Int. Cl.
*G01R 31/3185* (2006.01)
*G01R 31/317* (2006.01)

(52) U.S. Cl.
CPC .......... *G01R 31/318555* (2013.01); *G01R 31/31727* (2013.01); *G01R 31/318572* (2013.01)

(58) Field of Classification Search
CPC ...... G01R 31/318555; G01R 31/31727; G01R 31/318572
See application file for complete search history.

(56) References Cited

U.S. PATENT DOCUMENTS

| | | | |
|---|---|---|---|
| 6,483,338 B2 * | 11/2002 | Weng | G01R 31/31915 324/537 |
| 2017/0269157 A1 * | 9/2017 | Mao | G06F 12/0875 |
| 2022/0405165 A1 * | 12/2022 | Song | G06F 11/1044 |

OTHER PUBLICATIONS

H. Chunmei, Z. Zhenyang, G. Yang and X. Jingyanan, "A Implementation for Built-in Self-Testing of RapidIO by JTAG," 2019 IEEE 13th International Conference on ASIC (ASICON), Chongqing, China, 2019, pp. 1-4, (Year: 2019).*

* cited by examiner

*Primary Examiner* — Cynthia Britt
(74) *Attorney, Agent, or Firm* — Patterson + Sheridan, LLP (57) ABSTRACT

An integrated circuit (IC) chip device includes testing interface circuity and testing circuitry to test the operation of the IC chips of the IC chip device. The IC chip device includes a first IC chip that comprises first testing circuitry. The first testing circuitry receives a mode select signal, a clock signal, and encoded signals, and comprises finite state machine (FSM) circuitry, decoder circuitry, and control circuitry. The FSM circuitry determines an instruction based on the mode select signal and the clock signal. The decoder circuitry decodes the encoded signals to generate a decoded signal. The control circuitry generates a control signal from the instruction and the decoded signal. The control signal indicates a test to be performed by the first testing circuitry.

20 Claims, 11 Drawing Sheets

INTEGRATED CIRCUIT CHIP TESTING INTERFACE WITH REDUCED SIGNAL WIRES

TECHNICAL FIELD

Examples of the present disclosure generally relate to communicating signals for an integrated circuit (IC) chip testing interface, and, in more particular to, communicating signals of a testing interface between IC chips.

BACKGROUND

In a multiple integrated circuit (IC) chip device, multiple IC chips are connected to each other. A main IC chip (e.g., an anchor chip) is connected to one or more auxiliary IC chips (e.g., chiplets). To test the main IC chip and the auxiliary chips, test data is communicated to the main IC chip, and from the main IC chip to each of the auxiliary IC chips. A testing interface is used to communicate test data between the main IC chip and the auxiliary IC chips. A testing interface may be a Joint Test Action Group (JTAG) interface or an internal JTAG (iJTAG) interface. The main IC chip is connected to the auxiliary IC chips via a plurality of wires (traces) to communicate testing data between the main IC chips and the auxiliary chips. The test data is communicated via a plurality of signals over corresponding wires. To reduce test associated costs, the test data is communicated at a frequency of 100 MHz, or greater. However, to communicate the test data at frequencies of at least 100 MHz, the wiring overhead between the main IC chip and each of the auxiliary IC chip is high (e.g., the number of wires is high) and/or the lengths of the instructions within the test data is long. A high wiring overhead increases the cost of the corresponding device due to the large number wires that are needed to interface between a main IC chip and an auxiliary chip. Further, long instruction lengths increase the testing time. Accordingly, the manufacturing costs of corresponding IC chip are increased.

SUMMARY

In one example, an integrated circuit (IC) chip device includes a first IC chip. The first IC chip includes first testing circuitry that receives a mode select signal, a clock signal, and encoded signals. The first testing circuitry includes finite state machine (FSM) circuitry that determines an instruction based on the mode select signal and the clock signal. The first testing circuitry further includes decoder circuitry that decodes the encoded signals to generate a decoded signal. Further, the first testing circuitry includes control circuitry that generates a control signal from the instruction and the decoded signal. The control signal indicates a test to be performed by the first testing circuitry.

In one example, a multiple IC chip device comprises a first IC chip and a second IC chip. The first IC chip receives a mode select signal, a clock signal, and a test data signal, and comprises a first test access port (TAP) controller comprising encoder circuitry that generates encoded signals from the test data signal. The second IC chip comprises first testing circuitry that receives the mode select signal, the clock signal, and the encoded signals. The first testing circuitry further decodes the encoded signals to generate a decoded signal, and determines an instruction based on the mode select signal and the clock signal. Further, the first testing circuitry generates a control signal indicative of a test to be performed by the first testing circuitry.

In one example, a method comprises receiving, at a first IC chip, a mode select signal, a clock signal, and encoded signals. Further, the method includes determining, via FSM circuitry of the first IC chip, an instruction based on the mode select signal and the clock signal. The method further includes decoding, via decoder circuitry of the first IC chip, the encoded signals to generate a decoded signal, and generating a control signal from the instruction and the decoded signal. Further, the method includes performing a test within the first IC chip based on the control signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

In a system including multiple integrated circuit (IC) chips, testing data is communicated from a testing interface of a main IC chip to one or more auxiliary IC chips via multiple signal wires. The wires (traces) connect the main IC chip with each of the auxiliary IC chips. The testing interface is a Joint Test Action Group (JTAG) interface or an internal JTAG (iJTAG) interface. In one example, to reduce the number of wires that connect the main IC chip and each auxiliary IC chip, at least a portion of the test data is encoded by the main IC chip before being communicated to the auxiliary IC chips or within the main IC chip. Encoded test data uses allows for an increased amount of test data to be communicated over a smaller number of wires, as compared to conventional methods. Accordingly, the number of wires within the test interface is reduced. Reducing the number wires decreases the cost of the corresponding device and increases the amount of routing available for other signals within the multiple IC chip device. However, when the encoded test data is decoded, errors may be introduced.

In one example, the test data includes dynamic data and static data. Dynamic data is data that changes values over a period of time. Example dynamic data is clock data (e.g., clock signals), and program-counter data, among others. Static data is data that does not change values, or remains substantially constant, over the period of time during which the dynamic data changes values. Example static data includes finite state (FSM) indicator data, and instruction data, among others. In one examples, the static data is encoded and communicated within an IC chip and between IC chips, while the dynamic data is not encoded. Encoding the static data reduces the number of wires connecting the IC chips to each other, decreasing the manufacturing costs of the corresponding device. Further, communicating the dynamic data in a non-encoded state reduces errors as compared to systems that encode the dynamic data.

Figure 1:
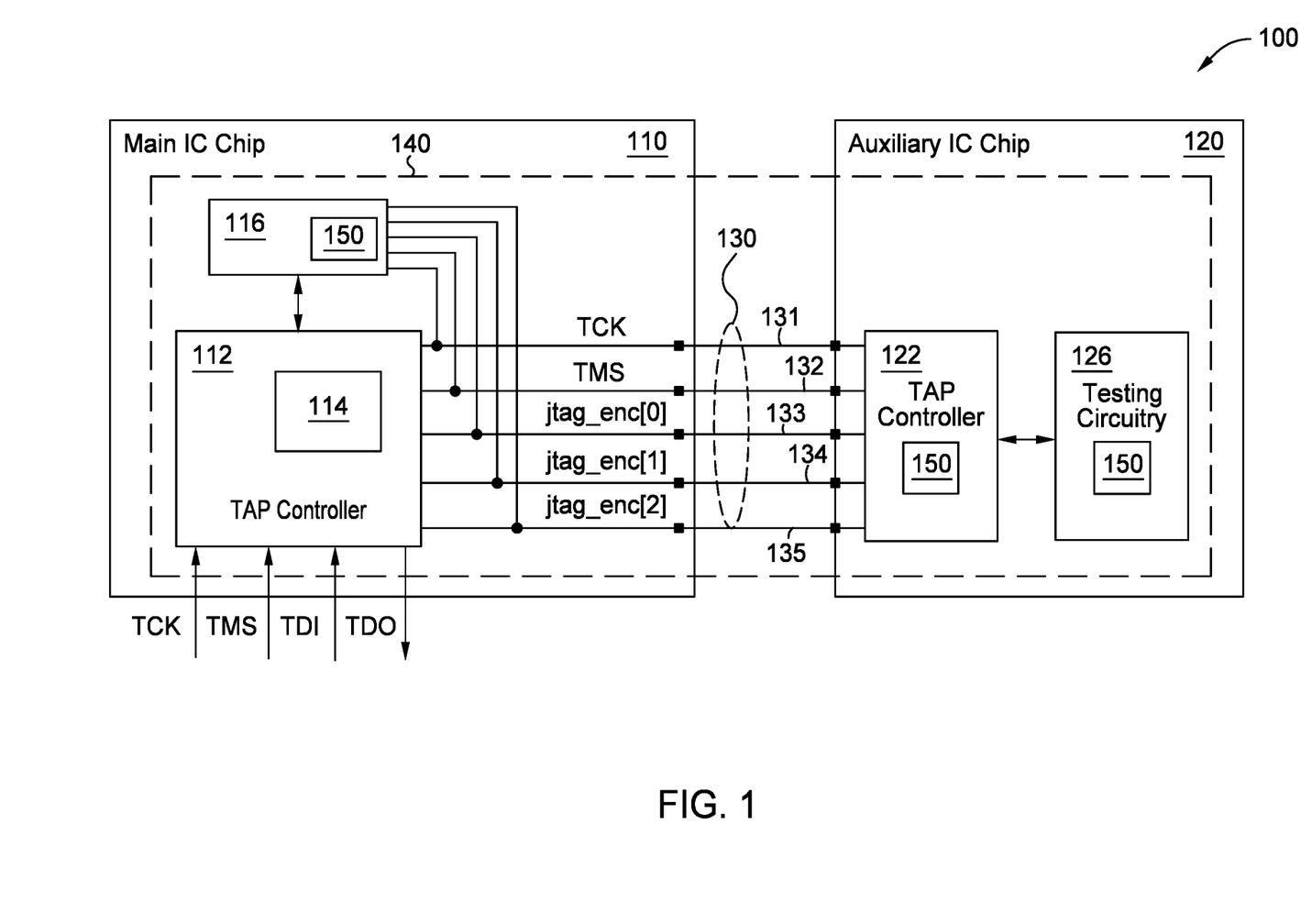
FIG. 1 is a block diagram depicting an example integrated circuit (IC) chip device, according to some examples.

FIG. 1 illustrates an IC chip device 100, according to one or more examples. The IC chip device 100 includes a main IC chip (e.g., anchor IC chip) 110, and an auxiliary IC chip (e.g., chiplet). The IC chip device 100 is illustrated as having two IC chips (e.g., the main IC chip 110 and the auxiliary IC chip 120). However, in other examples, the IC chip device 100 includes more than two IC chips. For example, the main IC chip 110 may be connected to more than one auxiliary IC chip. In one example, the main IC chip 110 and the auxiliary IC chip 120 are disposed on a common substrate (e.g., an interposer or another substrate device). In another example, the auxiliary IC chip 120 is mounted to the main IC chip 110, forming a three-dimensional IC chip stack.

The main IC chip 110 includes circuit blocks, such as power supply controllers and memory controllers, among others. The main IC chip 110 is an application specific IC (ASIC) or a programmable IC (e.g., a field programmable gate array (FPGA)). The main IC chip 110 includes a test access port (TAP) controller 112. The TAP controller 112 includes encoder circuitry 114. The TAP controller 112 is connected to testing circuitry 116. The testing circuitry 116 includes one or more controllers, boundary-scan cells, and registers. Further, the testing circuitry 116 includes the decoder circuitry 150. The testing circuitry 116 is used to perform tests within the main IC chip 110. For example, the testing circuitry 116 is used to determine connectivity and data errors within the main IC chip 110. The main IC chip 110 may further include transmitter circuitry, receiver circuitry, and/or other devices.

The auxiliary IC chip 120 may be a hardware accelerator, artificial intelligence (AI) engine, and/or a transceiver engine, among others. The use of the auxiliary IC chip 120 with a main IC chip 110 de-couples the development cycle of the main IC chip 110 from auxiliary IC chips (e.g., the auxiliary IC chip 120). Further, the use of a main IC chip 110 with auxiliary chips 120 allows for different types auxiliary chips to be used with a main IC chip in different configurations. In an example including multiple auxiliary chips 120, multiple different types of IC chips are connected to the main IC chip.

The auxiliary IC chip 120 is an ASIC or a programmable IC. The auxiliary IC chip 120 includes a TAP controller 122. The TAP controller 122 includes decoder circuitry 150. The auxiliary IC chip 120 further includes testing circuitry 126. The testing circuitry 126 is used to perform tests within the auxiliary IC chip 120. For example, the testing circuitry 126 is used to determine connectivity and data errors within the auxiliary IC chip 120. In one examples, the testing circuitry 126 includes decoder circuitry 150. Further, the testing circuitry 126 includes one or more controllers, boundary-scan cells, and registers. The testing circuitry 126 is used to perform tests within the main IC chip 110. The auxiliary IC chip 120 further includes transmitter circuitry, receiver circuitry, and/or other circuit devices. In one example, the TAP controller 122 omits the decoder circuitry 150.

The main IC chip 110 is connected to the auxiliary IC chip 120 via the wires 130. The wires 130 include wires 131-135. The wires 130 are routed within an interposer or another substrate. In one example, the wires 130 are routed in one or more layers of the same interposer or substrate on which the main IC chip 110 and the auxiliary IC chip 120 are mounted. In examples that include more than one auxiliary IC chip 120, the main IC chip 110 is connected to each of the auxiliary IC chips via wires configured similar to that of the wires 130.

In one example, the TAP controller 112, the testing circuitry 116, the TAP controller 122, the testing circuitry 126, and the wires 130 form a testing interface 140. In one example, the testing interface is a JTAG interface or an iJTAG interface.

As will be described in greater detail in the following, the testing circuitry 116 and the testing circuitry 126 tests interoperability among elements of the corresponding IC chip. For example, the testing circuitry 116 and 126 include boundary-scan cells that are used to test the input connections of the elements of the IC chips 110 and 120, the output connections of the elements of the IC chips 110 and 120, and bi-directional connections of the elements of the IC chips 110 and 120. In one or more examples, the boundary scan cells within each of the testing circuitries 116 and 126 are connected together to form a shift register in the respective IC chip. The boundary scan cells are accessed through a test data in (TDI) input and the TDI signal received by the corresponding TAP controller.

In one example, the TAP controller 112 receives test data including a test clock (TCK) signal, a test mode select (TMS) signal, and a TDI signal. The TCK signal is a clock control signal. The TMS signal controls the functionality of the testing interface 140. The TDI signal includes data corresponding to the type of test to be performed. The TAP controller 112 outputs the test data out (TDO) signal.

In one example, the TDI signal indicates a neither ijtag/bscan instruction, ijtag instruction, a EXTEST instruction, a SAMPLE instruction, a BYPASS instruction, EXTEST_SMPL instruction, EXTEST_PULSE instruction, EXTEST_TRAIN instruction, a high-z instruction, and/or a block ijtag reset_tap_b instruction. In one or more examples, the TDI signal may be indicative of other instructions. The neither ijtag/bscan instruction corresponds to an instruction where neither an ijtag or a boundary scan test is performed. The EXTEST instruction corresponds to a test in which the boundary-scan cells are used to test the interconnect structure between devices of an IC chip. The SAMPLE instruction selects the boundary-scan register and sets up the boundary-scan cells to sample values within the IC chip. A SAMPLE instruction may also include a PRELOAD instruction that is used to preload known values into the output boundary-scan cells prior to a follow-on operation. The BYPASS instruction bypasses one or more elements of the IC chip to test other elements of the IC chip. The EXTEST_SMPL instruction samples the data on the boundary-scan cells. The EXTEST_PULSE instruction generates a single pulse to the boundary-scan cells. The EXTEST_TRAIN generates a stream of pulses to the boundary-scan cells. A high-z instruction places the boundary-scan cells in a three state mode or an input receive mode. A block ijtag reset_tap_b instruction resets the corresponding TAP controller.

In one or more examples, the instructions are loaded into an instruction register of the TAP controller (e.g., the TAP controller 112 or the TAP controller 122) before being loaded into the boundary scan cells based on the TMS signal and the TCK signal.

The encoder circuitry 114 receives the TDI signal and encodes the TDI signal into encoded instruction signals (jtag_enc[0] signal, jtag_enc[1] signal, and the jtag_enc[2] signal). The encoded signals jtag_enc[0] signal, jtag_enc[1] signal, and the jtag_enc[2] signal are communicated via wires 133, 134, and 135 respectively. The encoded signals jtag_enc[0] signal, jtag_enc[1] signal, and the jtag_enc[2] are each two bit (binary) signals. Further, the TCK signal and the TMS signal are communicated from the TAP controller 112 to the TAP controller 122 via the wires 131 and 132, respectively.

The wires 131 and 132 are shielded, while the wires 133-135 are not shielded. For example, the wires 131 and 132 may be shielded on both sides. Further, the wires 131 and 132 may be disposed in a metal layer different from that of the metal layers 133-135. In one example, the wires 131 and 132 are formed in a metal layer above that of the metal layers 133-135. The TCK signal and the TMS signal are not encoded. The TAP controller 112 acts as a pass-through, passing the TCK signal and the TMS signal to the TAP controller 122 in a non-encoded state. In one example, the encoded signals jtag_enc[0] signal, jtag_enc[1] signal, and the jtag_enc[2] are communicated at a lower speed than of the the TCK signal and the TMS signal. In a typical iJTAG implementation, the iJTAG control signals (e.g., TCK signal and TMS signal) have a half cycle setup time and half cycle hold time even though the iJTAG control signals travel across the entire corresponding IC chip. However, as the encoded signals transition less frequently than the iJTAG control signals TCK and TMS, the encoded signals can be transmitted at a lower frequency than the TCK and TMS signals without the use of very high metal layer resources within the corresponding IC chip device, and without be required to meet the half cycle timing constraint. Accordingly, an IC chip device that employs encoded signals as described herein has improved performance as compared to an IC chip device that does not employ encoded signals as described herein. Further, an IC chip device that employs encoded signals as described herein uses a reduced number of high cost wires and corresponding shielding as compared to an IC chip device that does not employ encoded signals as described herein.

In one or more examples, the encoded signals jtag_enc[0], jtag_enc[1], and jtag_enc[2] are multi-bit signals. For example, the encoded signals jtag_enc[0], jtag_enc[1], and jtag_enc[2] are binary, trinary, or multi-bit signals having greater than three bits. The encoded signals may be referred together as encoded signal jtag_ir_enc[2:0]. Each bit of the encoded signal jtag_ir_enc[2:0] corresponds to a respective one of the encoded signals jtag_enc[0], jtag_enc[1], and jtag_enc[2].

In one example, the tap controller 112 determines the type of instruction from the TDI signal. The encoder circuitry 114 generates the encoded signals jtag_enc[0], jtag_enc[1], and jtag_enc[2] based on the determined instruction type. For example, the TAP controller 112 determines that neither an iJTAG or a boundary scan test is to be performed from the TDI signal. Accordingly, the encoder circuitry 114 determines that the value of each bit of the encoded signal jtag_ir_enc[2:0] and each of the encoded signals jtag_enc[0], jtag_enc[1], and jtag_enc[2] is 0.

Figure 2:
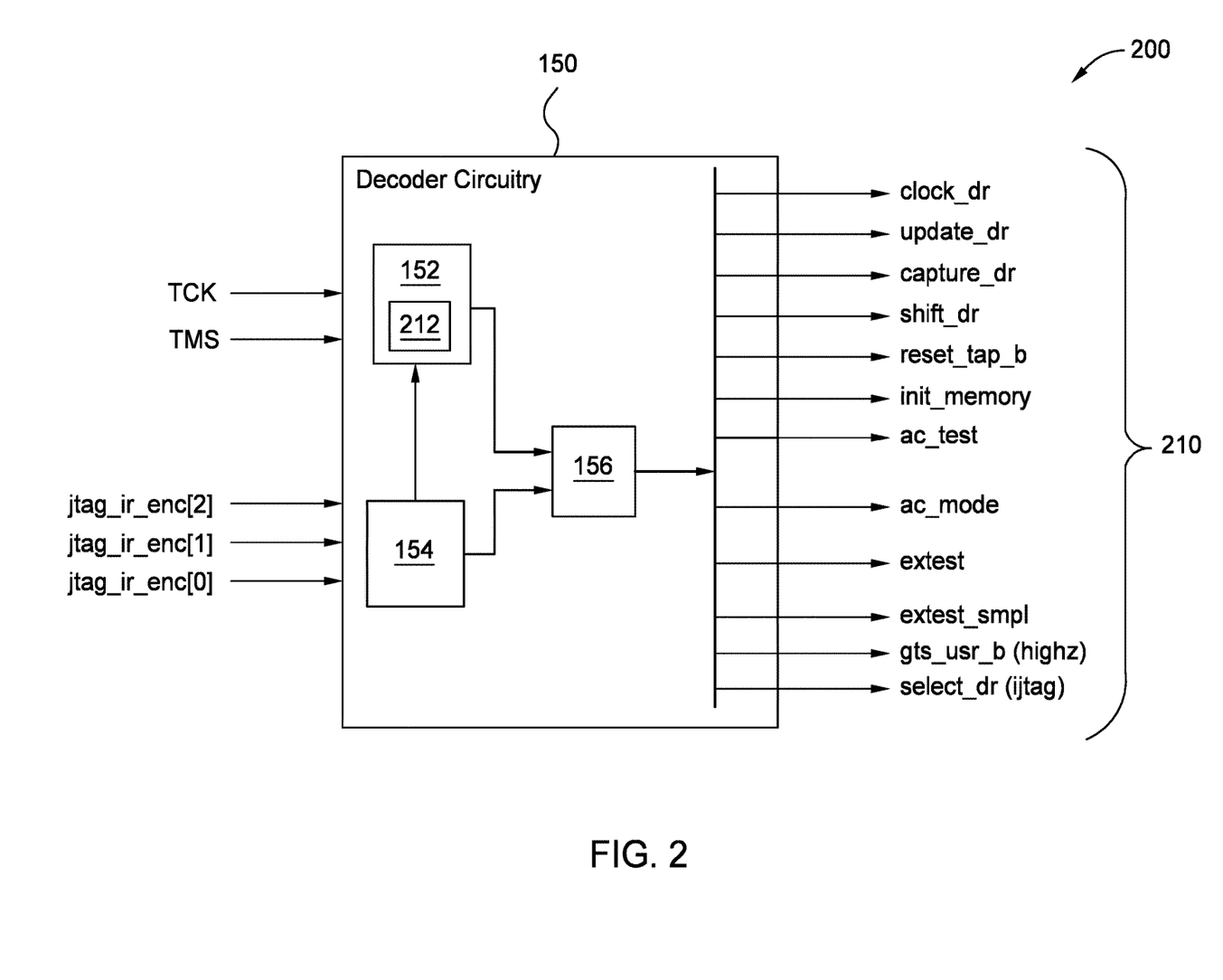
FIG. 2 illustrates a block diagram depicting an example test access port decoder circuitry, according to some examples.

FIG. 2 illustrates the decoder circuitry 150. The decoder circuitry 150 includes TAP FSM circuitry 152, decoder circuitry 154, and output circuitry 156. The decoder circuitry 150 receives the TCK signal, the TMS signal, and the encoded signals jtag_enc[0] signal, jtag_enc[1] signal, and the jtag_enc[2]. The decoder circuitry 150 determines and outputs the control signals 210. The control signals 210 correspond to an instruction signal output to the testing circuitry. For example, the control signals 210 include a clock_dr signal, update_dr signal, capture_dr signal, shift_dr signal, reset_tap_b signal, an init_memory signal, an ac_test signal, an extest signal, an extest_smpl signal, a highz signal, and a select_dr signal.

In one example, the clock_dr signal is a clock signal used for boundary scan (bscan) and iJTAG operation. The source of the clock_dr signal is the signal TCK signal. The clock_dr signal is transmitted based on the boundary or iJTAG instruction being entered. The update_dr signal, when asserted, is used to indicate that the shift chain data is ready to be copied into the destination memory locations. The capture_dr signal indicates the destination data to be copied into the shift chain, effectively performing a read operation. The shift_dr signal indicates that a shift chain is to act as a shift register and pass information the TDI pin to the TDO pin. The reset_tap_b signal indicates destination memory elements (e.g., flipflops) to be set or rest to a default value. The reset_tap_b signal corresponds to an asynchronous reset and does not require clock_dr pulse. The init_memory, ac_test, ac_mode, extest, extest_smpl, gts_usr_b signals are control signals used for a boundary scan operation. The select_dr signal indicates that the receiving memory elements (e.g. flipflops) are as part of enabled iJTAG network and act according to the shift_dr, capture_dr, update_dr signaling.

The decoder circuitry 154 determines an instruction based on the values of the encoded signals jtag_enc[0], jtag_enc[1], and jtag_enc[2]. For example, the decoder circuitry 154 may include a look-up-table (LUT) or some other decoding element that is used to determine the instruction from the values of the encoded signals jtag_enc[0], jtag_enc[1], and jtag_enc[2]. The encoded signals jtag_enc[0], jtag_enc[1], and jtag_enc[2] may be represented as [N, M, 0], wherein N corresponds to the value of jtag_enc[0], M corresponds to the value of jtag_enc[1], and 0 corresponds to the value of jtag_enc[2]. Accordingly, for [0, 0, 0] the decoder circuitry 154 determines that the instructions correspond to a neither ijtag/bscan instruction, for [0, 0, 1] the decoder circuitry 154 determines that the instructions correspond to an ijtag instruction, for [0, 1, 0] the decoder circuitry 154 determines that the instructions correspond to an EXTEST instruction, for [0, 1, 1] the decoder circuitry 154 determines that the instructions correspond to an EXTEST_SMPL instruction, for [1, 0, 0] the decoder circuitry 154 determines that the instructions correspond to an EXTEST_PULSE instruction, for [1, 0, 1] the decoder circuitry 154 determines that the instructions correspond to an EXTEST_TRAIN instruction, for [1, 1, 0] the decoder circuitry 154 determines that the instructions correspond to a high-z instruction, and for [1, 1, 1] the decoder circuitry 154 determines that the instructions correspond to an block ijtag reset_tap_b instruction. In other examples, other values of the encoded signals jtag_enc[0], jtag_enc[1], and jtag_enc[2] may be used to determine other instructions.

The TAP FSM circuitry 152 includes a data register (DR) 212 and determines a corresponding instruction based on the values of the TMS signal and the TCK signal. For example, the TAP FSM circuitry 152 includes a plurality of states of a FSM 300 of FIG. 3. The states of the FMS 300 are traversed based on the values of the TMS signal and the TCK signal. In one example, the TAP FSM circuitry 152 starts at state 310, test logic rest. At state 310, the test circuitry 116 or 126 is reset. Based on the TMS signal having a value of 1 (e.g., a high voltage value), the state 310 is repeated. The value of the TMS signal is determined at each cycle of the TCK signal. Based on the TMS signal transitioning from a value of 1 to a value of 0 (e.g., a low voltage value), the TAP FSM circuitry 152 moves from state 310 to state 312, run-test/idle. At the state 312, the test circuitry is initialized and idle mode is set. Based on the TMS signal having a value of 0, the state of the TAP FSM circuitry 152 stays in state 312. Based on the TSM signal transitioning to a value 1, the TAP FSM circuitry 152 moves to the state 314. At state 314, a data register scan (DR-Scan) is selected. Based on the TSM signal transitioning to a value of 0, the TAP FSM circuitry 152 moves to state 316, capture-DR. At step 316, a parallel-load procedure is used to load test data in to the current data register. At state 316, based on the TSM signal maintaining a value of 0, the TAP FSM circuitry 152 moves to state 318, shift-DR. At step 318, data of the testing circuitry is shifted to a TDO output or other output. At state 318, based on the TMS signal maintaining a value of 0, the state 318 is maintained.

Figure 3:
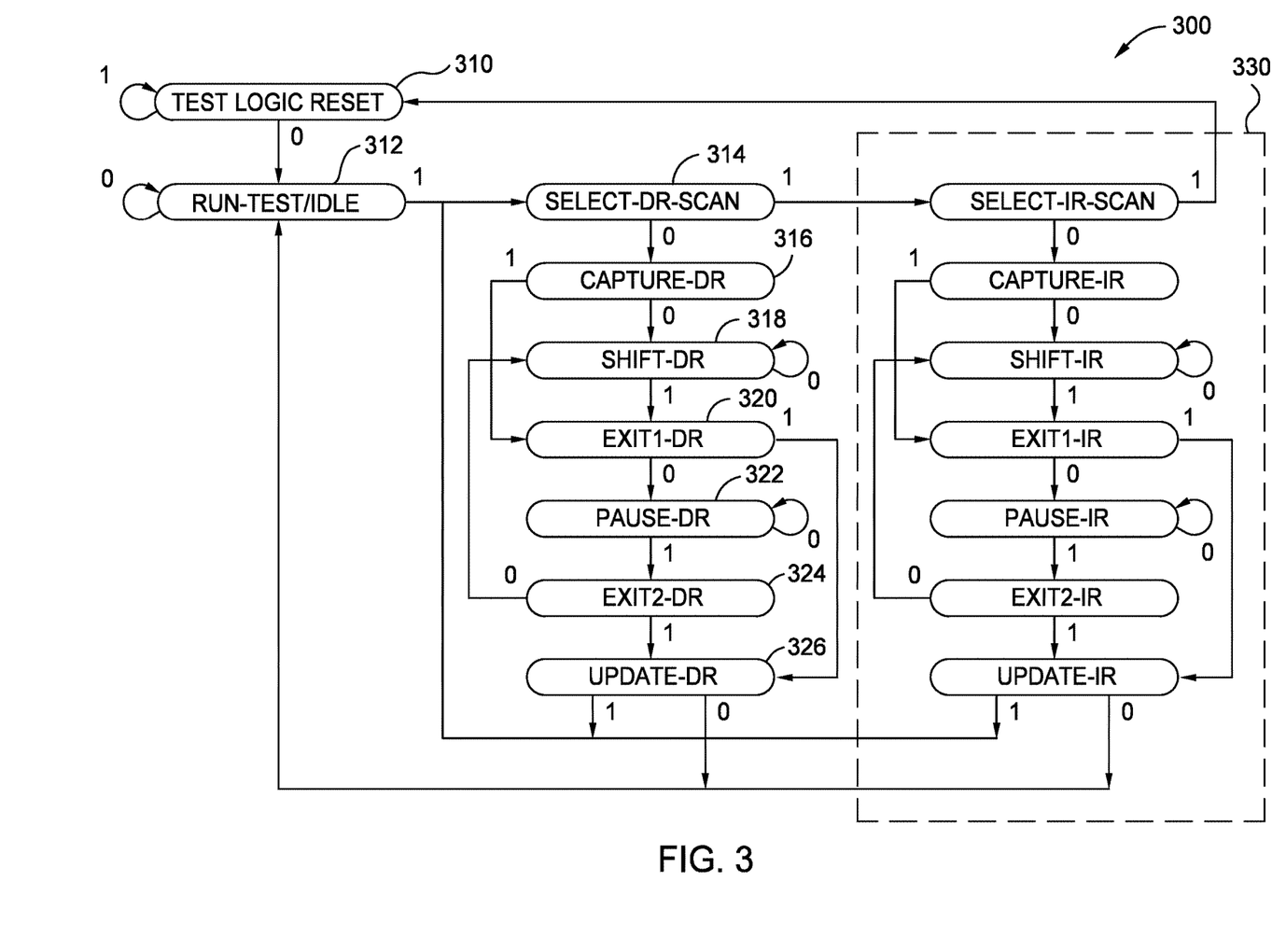
FIG. 3 illustrates a diagram of a state machine, according to some examples.

At state 316, based on the TMS signal transitioning to a value of 1, the TAP FSM circuitry 152 moves to state 320, Exit1-DR. At state 320, the selected DR is excited. Further, at state 318, based on the TMS signal transitioning to a value of 1, the TAP FSM circuitry 152 moves to state 320, Exit1-DR. At state 320, based on the TMS signal transitioning to a value of 0, the TAP FSM circuitry 152 transitions to state 322, Pause-DR. At state 322, the shifting of test data within the test circuitry is paused. At state 322, based on the determination that the TMS signal maintains a value of 0, the state 322 is maintained. At state 320, based on the determination that the TMS signal transitions to a value of 1, the TAP FSM circuitry 152 proceeds to state 326, update-DR. At state 326 data in the data register of the test circuitry is latched. At state 322, based on the determination that the TMS signal transitions to a value of 1, the TAP FSM circuitry 152 proceeds to state 324. At state 324, based on the determination that the TMS signal maintains a value of 1, the TAP FSM circuitry 152 proceeds to state 326. Further, at state 324, based on the determination that the TMS signal transitions to value of 0, the TAP FSM circuitry 152 proceeds to state 318. At state 326, based on a determination that the TMS signal maintains a value of 1, the TAP FSM circuitry 152 proceeds to the state 314. At state 326, based on a determination that the TMS signal transitions to a value of 0, the TAP FSM circuitry 152 proceeds to the state 312.

At state 314, based on the TMS signal maintaining a value of 1, the TAP FSM circuitry 152 proceeds to state 330. Further, based on the TMS signal maintaining a value of 1, the TAP FSM circuitry 152 proceeds to state 310. However, as the TAP FSM circuitry 152 does not include an instruction register, the TAP FSM circuitry 152 is not updated as the TAP FSM circuitry 152 proceeds through the states 330.

The state of the TAP FSM circuitry 152 is output to the output circuitry 156. Further, the decoded instruction generated by the decoder circuitry 154 is output to the output circuitry 156. The output circuitry 156 generates one or more of the control signals 210 based on the decoded instruction and the state of the TAP FSM circuitry 152. The control signals 210 are output to the test circuitry. For example, the control signals are output to the boundary-scan cells and registers of the corresponding test circuitry.

In one or more examples, the decoder circuitry 154 outputs the decoded instruction as a single output signal. For example, the decoder circuitry 154 outputs the signal jtag_ir_enc[2:0] from an encoded signal value of 001. The output circuitry 156 identifies the active instruction and combines the active instruction with the state of the TAP FSM circuitry 152 to drive corresponding output signals 210 (e.g., output signals select_dr, capture_dr, update_dr, and/or shift_dr) at the appropriate times based on the state of the TAP FSM circuitry 152 (e.g., capture-dr, shift-dr and update-dr). In another example, for an encoded signal value of 010, the decoder circuitry outputs the bscan extest instruction. The output circuitry 156 determines that the extest instruction is active, and outputs the corresponding control signals 210 (e.g., control signals extest, extest_smpl, init_memory, capture_dr, shift_dr and update_dr) at the appropriate times depending on the state of the TAP FSM circuitry 152.

Figure 4:
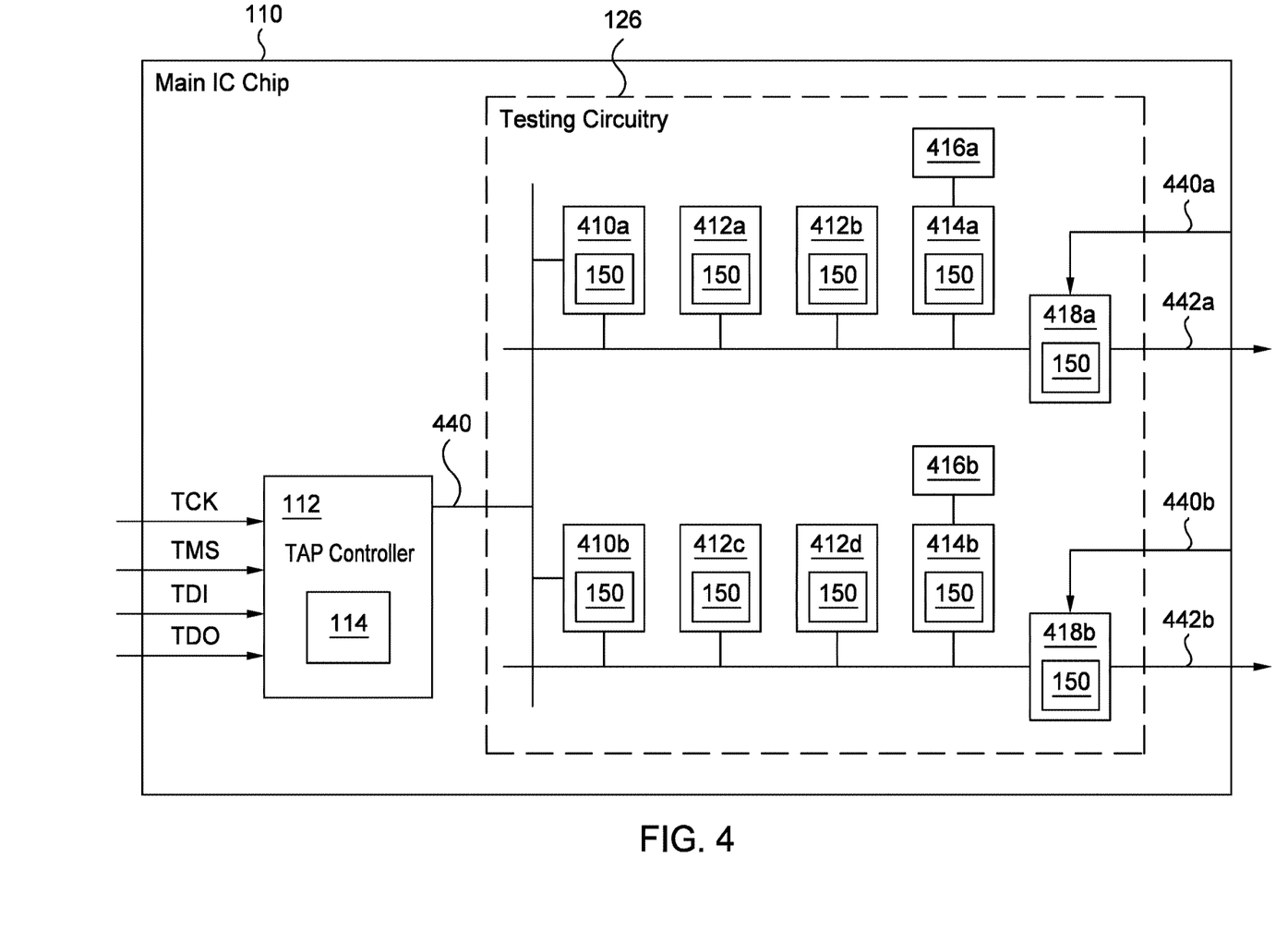
FIG. 4 is a block diagram depicting an example main IC chip, according to some examples.

FIG. 4 illustrates the main IC chip 110. As illustrated in FIG. 2, the test circuitry 116 includes selection controllers 410a and 410b, dynamic function exchange controllers (DFX) controllers 412a, 412b, 412c, 412d, adapter circuitry 414a, 414b, DFX controllers 416a, 416b, and auxiliary detect circuitry 418a, 418b.

The selection controllers 410, the DFX controllers 412, the adapter circuitry 414, and auxiliary detect circuitry 418 are connected to the communication bus 420. In one example, the TAP controller 112 is connected to the communication bus 420, and communicates the TMS signal, the TCK signal, the encoded signal jtag_enc[0], the encoded signal jtag_enc[1], and the encoded signal jtag_enc[2] via the communication bus 420.

The selection controller 410a couples or decouples the DFX controllers 412a and 412b, the adapter circuitry 414a, and the auxiliary detect circuitry 418a to and from the communication bus 420. For example, the selection controller 410a determines whether or not the DFX controllers 412a, 412b, the adapter circuitry 414a, and the auxiliary detect circuitry 418a receive the TMS signal, the TCK signal, the encoded signal jtag_enc[0], the encoded signal jtag_enc[1], and the encoded signal jtag_enc[2] from the TAP controller 112.

The DFX controllers 412 control reconfigurable designs within the main IC chip 110 based on bistreams. In one or more examples, the adapter circuitries 414 provide the DFX controllers 416 with additional functionality not available within the DFX controllers 416. In such examples, the DFX controllers 412 may have more functionality than that of the DFX controllers 416.

The auxiliary detect circuitries 418 determine whether or not a corresponding auxiliary IC chip (e.g., the corresponding auxiliary IC chip 120) is connected to the main IC chip 110. In one example, the auxiliary detect circuitries 418 receive a control signal 440 and determines whether or not that an auxiliary IC chip is connected based on the control signal 440. Based on a determination that an auxiliary IC chip is connected, the auxiliary detect circuitries output signal 442 that includes the TMS signal, the TCK signal, the encoded signal jtag_enc[0], the encoded signal jtag_enc[1], and the encoded signal jtag_enc[2] to the auxiliary IC chip. In one example, the auxiliary detect circuitry 418a receives the control signal 440a. Based on the control signal 440a having a zero voltage level (or another predefined voltage level), the auxiliary detect circuitry 418a determines that an auxiliary IC chip is connected to the main IC chip 110 and outputs the signals 442a. Further, the auxiliary detect circuitry 418b receives the control signal 440b. Based on the control signal 440a having a zero voltage level (or another predefined voltage level), the auxiliary detect circuitry 418b determines that an auxiliary IC chip is connected to the main IC chip 110 and outputs the signals 442a.

The signals 442a include the TMS signal, the TCK signals, the encoded signal jtag_enc[0], the encoded signal jtag_enc[1], and the encoded signal jtag_enc[2]. Each of the signals 442a are each communicated over a respective wire (e.g., wires 131-135).

The selection controllers 410, the DFX controllers 412, and the adapter circuitries 414 include decoder circuitry 150. The decoder circuitry 150 receives the TMS signal, the TCK signal, the encoded signal jtag_enc[0], the encoded signal jtag_enc[1], and the encoded signal jtag_enc[2], and determines the corresponding testing instructions as is described above with regard to FIGS. 2 and 3 and described in the following with regard to FIGS. 10 and 11.

Figure 5:
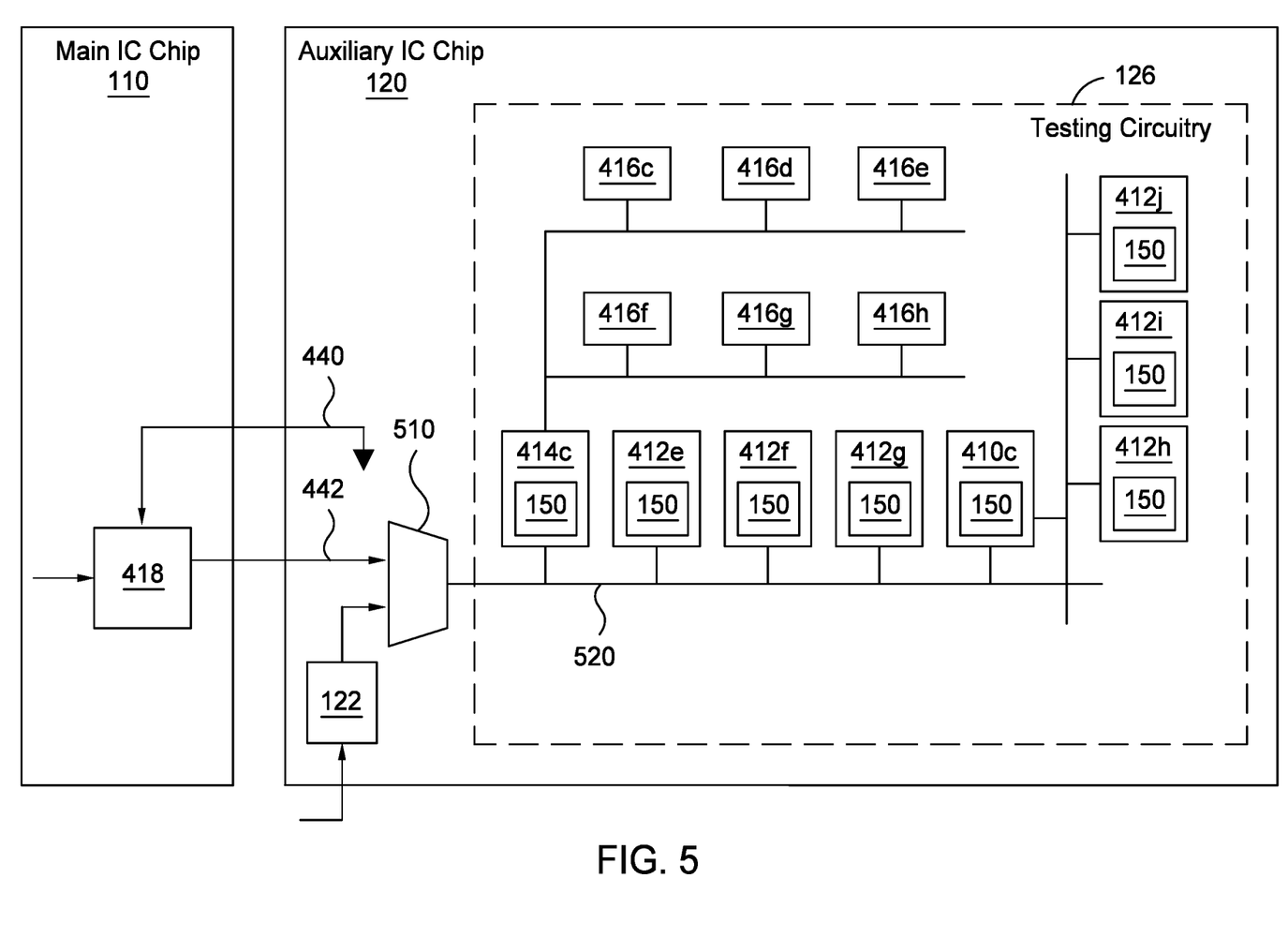
FIG. 5 is a block diagram depicting an auxiliary IC chip, according to some examples.

FIG. 5 illustrates a portion of the main IC chip 110 and the auxiliary IC chip 120. As illustrated in FIG. 5, the main IC chip 110 is connected to the auxiliary IC chip 120 via the auxiliary detect circuitry 418. The auxiliary IC chip 120 includes a multiplexer 510 that receives the signals 442 from the auxiliary detect circuitry 418 of the main IC chip 110 via wires (e.g., the wires 131-135). Further, the multiplexer 510 receives the output of the TAP controller 122. The TAP controller 122 receives the TMS signal, TCK signal, TDI signals, and outputs a TDO signal. The multiplexer 510 selects one of the output of the TAP controller 122 and the signals 442. In one example, the multiplexer 510 outputs the signals 442 or the output the TAP controller 122 to the testing circuitry 126 via a communication bus 520. The testing circuitry 126 includes DFX controllers 412e-412i, the adapter circuitry 414c, DFX controllers 416c-416h, and selection controller 410c. As is described above, the DFX controllers 412e-412i, the adapter circuitry 414c, and the selection controller 410c include decoder circuitry 150.

In one or more examples, when the IC chip 120 is tested on a wafer independently, the IC chip 110 is not present to drive the IC chip 110. In such an example, a TAP controller is used (e.g., TAP controller 122) to communicate test data to the testing circuitry. When wafer level test of the IC chip 120 has been completed, the IC chip 120 is integrated in a package with the IC chip 110. The integrated IC chip 120 is then tested again as part of the package. In such an implementation, the signal 442 is used to test the IC chip 120 within the package. The use of signal 442 allows for the use of minimal signal count while keeping the testing interface instructions length also at a minimum. Further, when using the signal 442, the IC chips are not daisy chained together within the package with the iJTAG network of TAP controllers. When daisy chaining the IC chips together, each IC chip adds a corresponding instruction register to the chain. In such an example, as the number of auxiliary IC chips 120 (e.g., chiplets) increases, the shift time for instructions increases, negatively impacting test time and an IC chip debug process. Accordingly, using the signal 442 as part of the IC chip test process reduces the test time and improves the debug process.

The auxiliary IC chip 120 drives the chip detect signal 440 with a ground signal (e.g., a logic value of 0 or low voltage value). Accordingly, the auxiliary detect circuitry 418 determines that the IC chip 120 is present based on the chip detect signal 440 being driven with a ground signal. In one or more examples, the auxiliary IC chip 120 is not present (e.g., omitted). In such an example, the auxiliary detect circuitry 418 is driven by weak pullup circuitry within the IC chip 110 that drives the chip detect signal 440 with a logic value of 1 (e.g., or a high voltage value).

Figure 6:
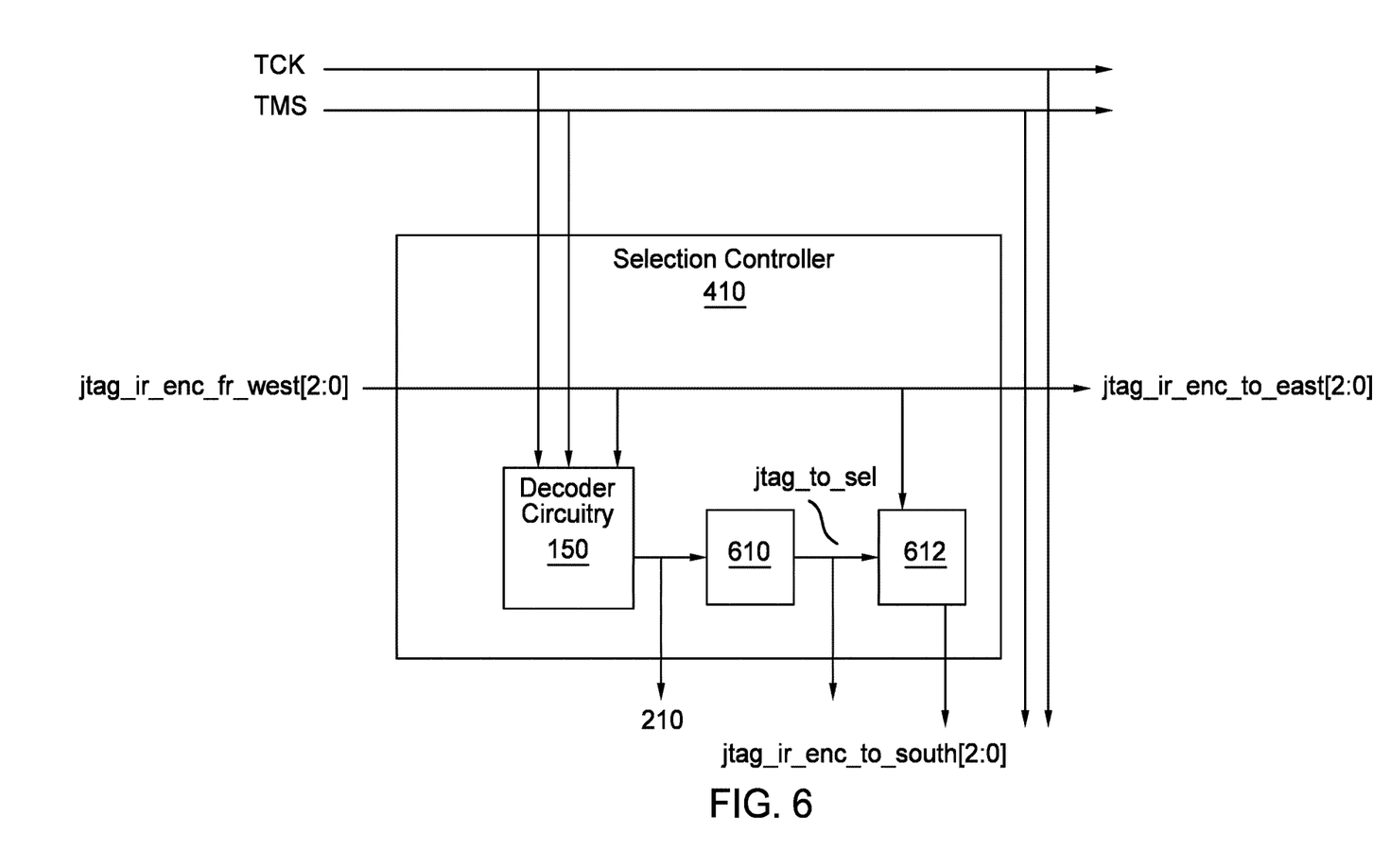
FIG. 6 is a block diagram depicting a controller, according to some examples.

FIG. 6 illustrates the selection controller 410. The selection controller 410 receives the encoded signal jtag_ir_enc_fr_west[2:0]. The encoded signal jtag_ir_enc_fr_west[2:0] includes the encoded signal jtag_enc[0], the encoded signal jtag_enc[1], and the encoded signal jtag_enc[2]. Further, the selection controllers 410 receives the TCK signal and TMS signal. The selection controller 410 outputs the encoded signal jtag_ir_enc_fr_west[2:0] as the encoded signal jtag_ir_enc_to_east[2:0]. The encoded signal jtag_ir_enc_fr_west[2:0] is the same signal as the encoded signal jtag_ir_enc_to_east[2:0]. The decoder circuitry 150 receives the encoded signal jtag_ir_enc_fr_west[2:0], the TCK signal, and the TMS signal and generates the control signal 210. The selection controller 410 further includes segment insertion bit (SIB) circuitry 610 and circuitry 612. The SIB circuitry 610 and IR circuitry 612 receives the control signal 210 and the encoded signal jtag_ir_enc_fr_west[2:0] and outputs the control signal 210 and the encoded signal jtag_ir_enc_to_south[2:0]. In one example, the TAP decoder block 150 provides the signals that are expected by the SIB circuitry 610 for normal operation. The circuitry 612 receives the output of the SIB circuitry 610 and re-encodes the encoded signals (jtag_ir_enc_to_south[2:0]) which are sent to on to further SIB circuitries and the endpoints of the testing network.

Figure 7:
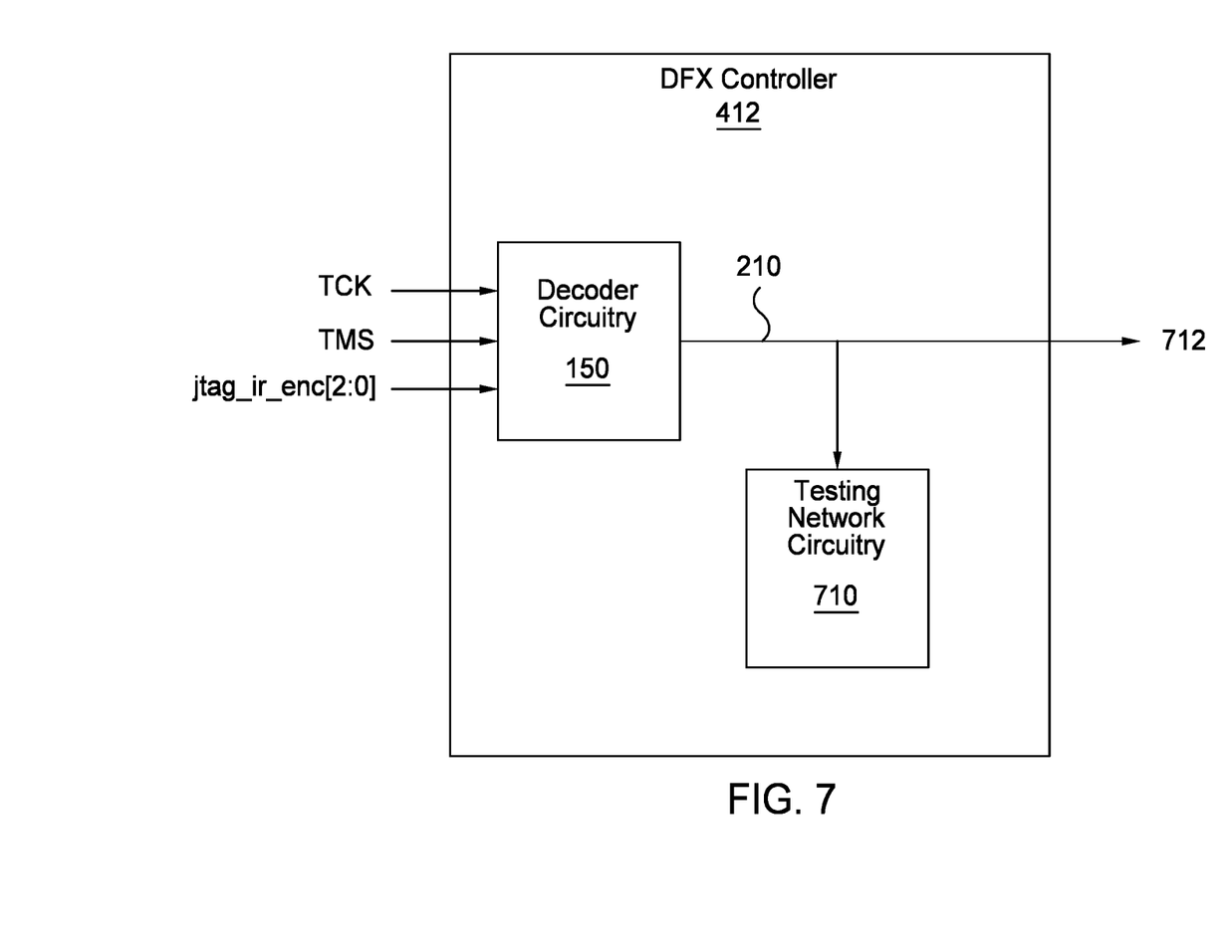
FIG. 7 is a block diagram depicting a controller, according to some examples.

FIG. 7 illustrates the DFX controller 412. The DFX controller 412 includes decoder circuitry 150 and testing network circuitry 710. The decoder circuitry 150 outputs the control signal to the testing network circuitry 710, and testing elements 712. The testing network circuitry 710 and the testing elements 712 perform tests based on the control signals 210. In one example, FIG. 7 illustrates an endpoint of a testing network. The decoder circuitry 150 provides the full encoded signal expansion from the encoded signal jtag_ir_enc[2:0]. The testing network circuitry 710 receives the control signal 210. The elements of the testing network circuitry 710 include SIBs, test data registers (TDRs), boundary scan test instruments, and/or iJTAG test instruments.

Figure 8:
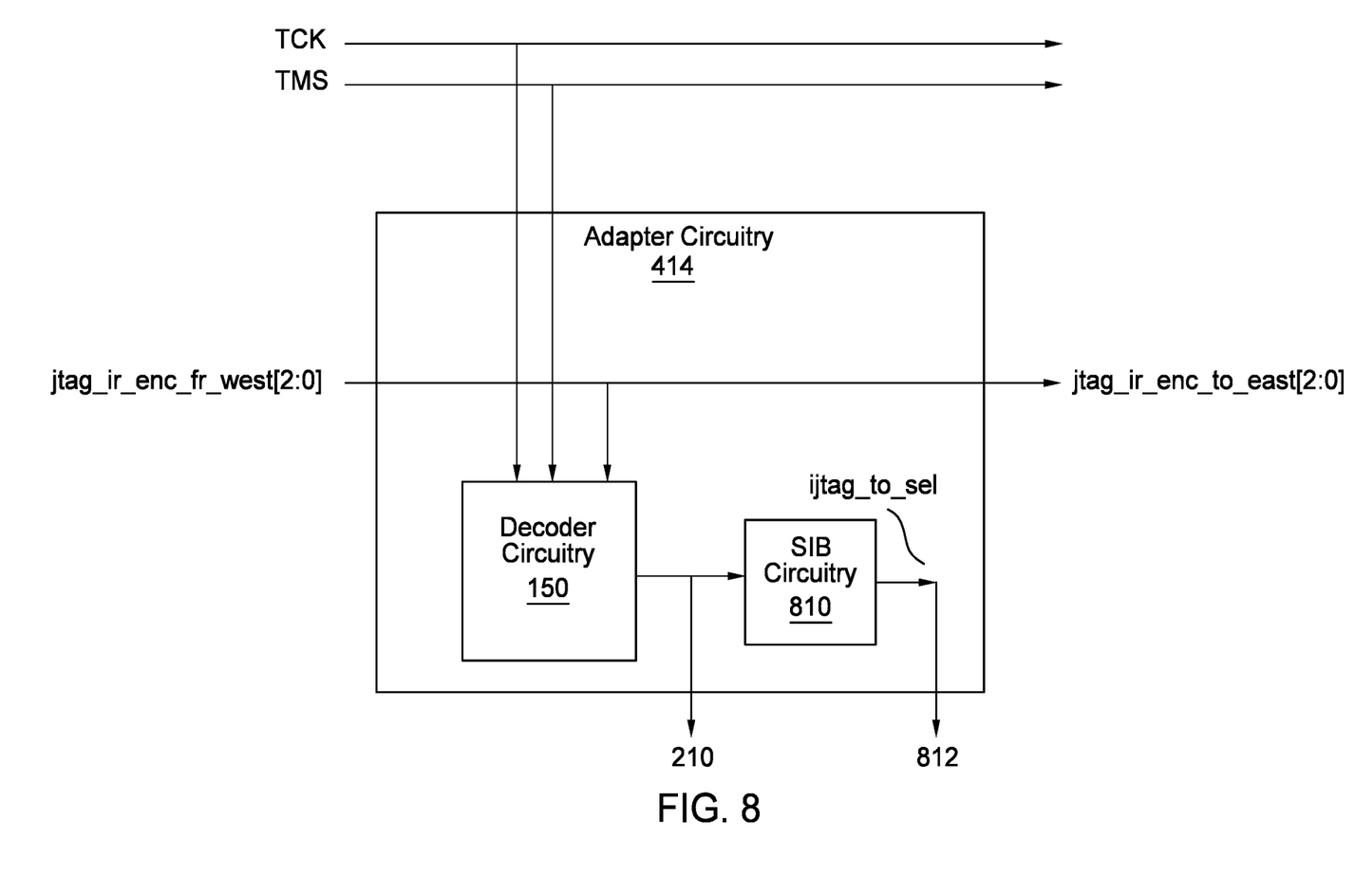
FIG. 8 is a block diagram depicting adapter circuitry, according to some examples.

FIG. 8 illustrates the adapter circuitry 414. The adapter circuitry 414 includes decoder circuitry 150 and SIB circuitry 810. The adapter circuitry 414 receives the TCK signal, the TMS signal, the encoded signal jtag_ir_enc_fr_west[2:0], and outputs the encoded signal jtag_ir_enc_fr_east[2:0], the control signal 210, and control signal 812. The SIB circuitry 810 generates the control signal 812 based on the control signal 210.

Figure 9:
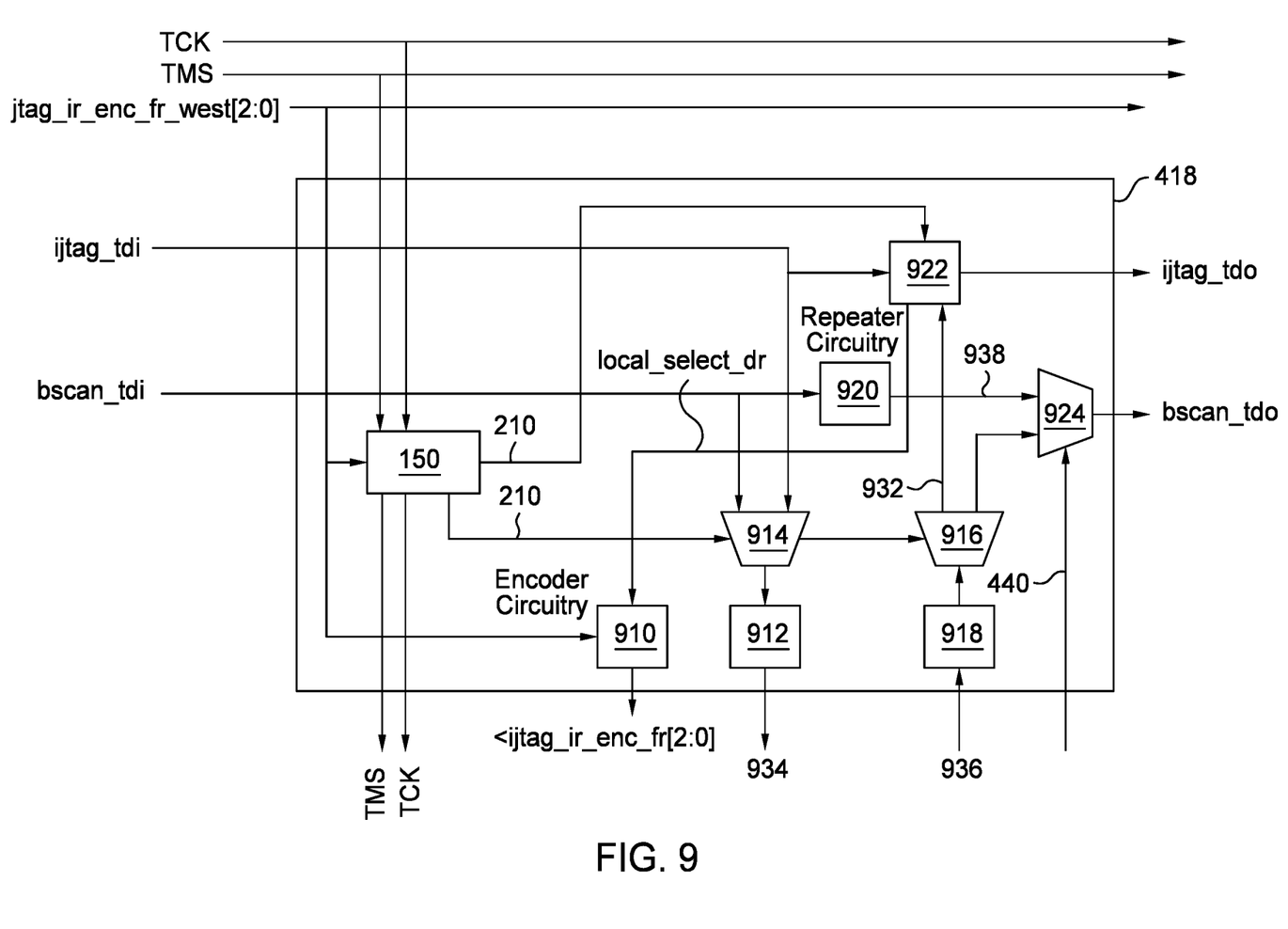
FIG. 9 is a block diagram depicting auxiliary detect circuitry, according to some examples.

FIG. 9 illustrates the auxiliary detect circuitry 418. The auxiliary detect circuitry 418 includes decoder circuitry 150, encoder circuitry 910, repeater circuitry 912, multiplexer 914, demultiplexer 916, repeater circuitry 918, repeater circuitry 920, SIB circuitry 922, and multiplexer 924. The auxiliary detect circuitry 418 receives the TCK signal, the TMS signal, and the encoded signal jtag_ir_enc_fr_west[2:0]. Further, the auxiliary detect circuitry 418 receives the jtag_tdi signal and the bscan_tdi signal. The jtag_tdi signal and the bscan_tdi signal may be received from other elements within the IC chip 110. For example, jtag_tdi signal and the bscan_tdi signal may be received from another one of the selection controllers 410, DFX controllers 412, adapter circuitry 414, DFX controllers 416, or auxiliary detect circuitries 418.

The decoder circuitry 150 receives the TCK signal, the TMS signal, and the encoded signal jtag_ir_enc_fr_west[2:0]. The decoder circuitry 150 generates the control signal 210. The SIB circuitry 922 receives the control signal 210, the ijtag TDI signal, and the signal 932 from the demultiplexer, and generates the jtag TDO signal and the local_select_dr signal. The jtag TDO signal is output to an adjacent one of the selection controllers 410, DFX controllers 412, adapter circuitry 414, DFX controllers 416, or auxiliary detect circuitries 418 within the IC chip 110. The encoder circuitry 910 receives the encoded signal jtag_ir_enc_fr_west[2:0] and the local_select_dr signal and generates the encoded signal jtag_ir_enc_fr[2:0]. The encoded signal jtag_ir_enc_fr[2:0] is output from the auxiliary detect circuitry 418 to the IC chip 120. In one example, such a process uses a single TDI pin and a single TDO pin to communicate between IC chips. The multiplexer 914 receives the bscan_tdi signal and the jtag_tdi signal and selects one of the bscan_tdi signal and the jtag_tdi signal based on the control signal 210. The repeater circuitry 912 receives the output of the multiplexer 914 and generates the TDO signal 934.

In one example, the auxiliary detect circuitry 418 switches between two networks. For example, the auxiliary detect circuitry 418 switches between a boundary scan test network, which is a long un-segmented shift chain that connects all the input and output pin drivers of the IC chip 110, and an iJTAG network that is a segmented (hierarchical) testing network. To reduce signal count within the testing interface, the auxiliary detect circuitry 418 uses multiplexer 914 to drive a single TDO pin to another IC chip (e.g., IC chip 120) depending on the type of instruction decoded from jtag_ir_enc[2:0]. The multiplexer 914 drives the repeater circuitry that aids in timing by re-generating the signal to be valid close to the rising clock edge of the TCK signal.

The repeater circuitry 918 receives the TDI signal 936 from an auxiliary IC chip (e.g., the auxiliary IC chip 120). In one example, the repeater circuitry 918 aligns the TDI signal 936 with a rising edge of the TCK signal. The output of the repeater circuitry 918 is input to the demultiplexer 916. The demultiplexer 916 generates the signals 932 and 933 from the output of the repeater circuitry 918 based on the control signal 210. The repeater circuitry 920 receives the bscan_tdi signal and outputs the signal 938. The repeater circuitry 920 aligns the bscan_tdi signal with a rising edge of the TCK signal. The multiplexer 924 receives the signal 938 and the signal 933 and outputs the bscan_tdo signal. In one example, when an auxiliary IC chip is present, e.g., the IC chip 120, the chip detect signal 440 is a value of logic 0. Accordingly, in such an example, the multiplexer 924 selects and outputs the signal 933 as the bscan_td0 signal.

Figure 10:
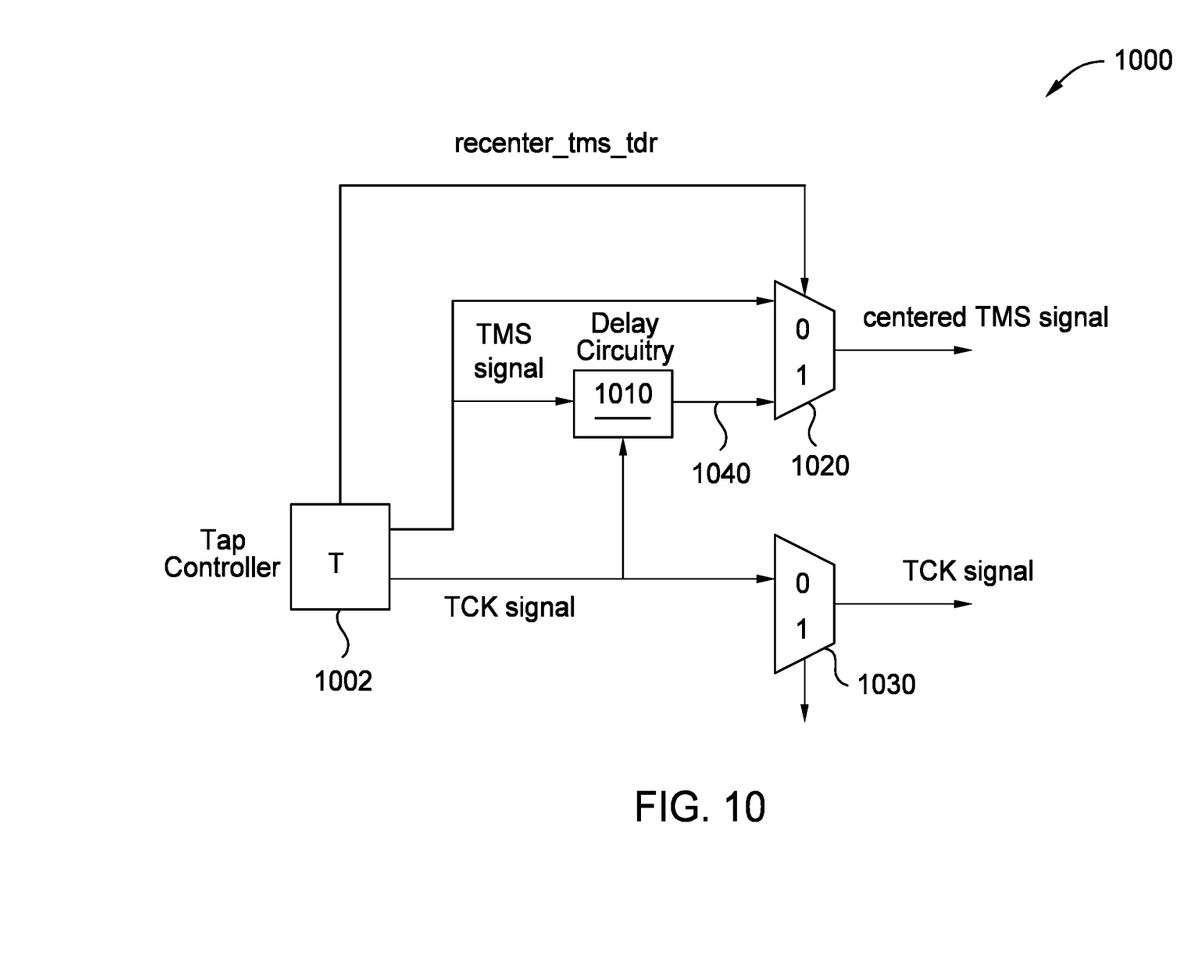
FIG. 10 is a block diagram depicting alignment circuitry, according to some examples.

FIG. 10 illustrates alignment circuitry 1000, according to one or more examples. The alignment circuitry 1000 may be implemented with the TAP controller 112 and/or 122. The alignment circuitry 1000 aligns the TMS signal with the TCK signal by centering the TMS signal with a falling edge of the TCK signal. The alignment circuitry 1000 includes delay circuitry 1010, multiplexer 1020, and multiplexer 1030. The delay circuitry 1010 receives the TMS signal and the TCK signal from the TAP controller 1002, and generates the signal 1040. In one example, the delay circuitry 1010 is a lookup latch that opens when the TCK signal has a low value (e.g., a logic value of 0). In one example, when the TCK signal is low, the TMS signal propagates as signal 1040. Accordingly, any change in the TMS signal is centered at the falling edge of the TCK signal, ensuring that timing of the TMS signal has a half-cycle of margin for setup time and a half-cycle margin for hold time. The TAP controller 1002 is configured similar to that of the TAP controller 112 or 122. The multiplexer 1020 receives the TMS signal from the TAP controller 1002 and the signal 1040 and outputs a centered TMS signal based on the select signal recenter_tms_tdr received from the TAP controller 1002. The multiplexer 1030 receives the TCK signal from the TAP controller and outputs the aligned TCK signal.

In one or more examples, the alignment circuitry 1000 maintains a maximum safe setup and hold margin for the TMS signal. To maintain these operating margins, the TCK signal and TMS signal are routed similarly. If the TCK signal and the TMS signal are not routed similarly, the TCK signal will propagate faster, reducing the setup margin of the TMS signal. The multiplexer 1030 matches the multiplexer 1020 to maintain the same propagation delay for the TCK signal and the TMS signal.

Figure 11:
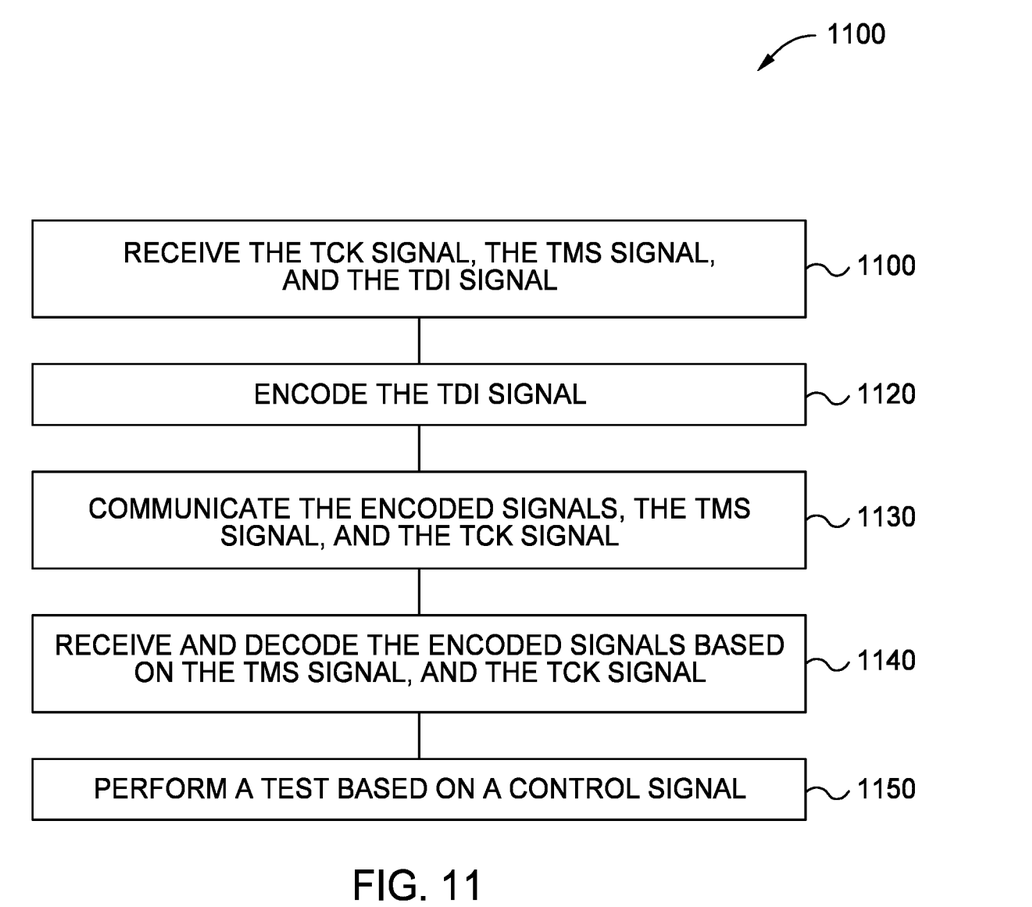
FIG. 11 is a flowchart of a method for communicating test data, according to some examples.

FIG. 11 illustrates a flowchart a method 1100 for communicating testing data, according to one or more examples. At 1110 of the method 1100, the TAP controller 112 receives the TCK signal, the TMS signal, and the TDI signal. At 1120 of the method 1100, the TDI signal is encoded by encoder circuitry 114. The TDI signal is encoded into the encoded signal jtag_enc[0], the encoded signal jtag_enc[1], and the encoded signal jtag_enc[2]. At 1130 of the method 1100, the encoded signals (e.g., the encoded signal jtag_enc[0], the encoded signal jtag_enc[1], and the encoded signal jtag_enc[2]), the TMS signal, and the TDI signal are communicated from the TAP controller 112 to the TAP controller 122. The TAP controller 112 communicates the TMS signal via the wire 132, the TCK signal via the wire 131, and the encoded signals via wires 133-135, respectively.

At 1140 of the method 1100, the TAP controller 122 receives the encoded signals, the TMS signal, and the TCK signal and decodes the encoded signals. In one example, the decoder circuitry 154 decodes the encoded signals jtag_enc[0], jtag_enc[1], and jtag_enc[2] to determine an instruction based on the values of the encoded signals jtag_enc[0], jtag_enc[1], and jtag_enc[2]. Further, the TAP FSM circuitry 152 determines a corresponding instruction based on the values of the TMS signal and the TCK signal. The instruction and decoded signal are used to determine a control signal.

At 1150 of the method 1100, the test circuitry 126 performs a test based on the control signal. The test circuitry 126 tests the interoperability among and/or functions of the elements of the auxiliary IC chip 120. Test results are communicated from the auxiliary IC chip 120 to the main IC chip 110.

As is described above, a multiple IC chip device communicates test data from a main IC chip to an auxiliary IC chip. A portion of the test data is encoded and a portion of the test data is not encoded before it is communicated from the main IC chip to the auxiliary IC chip. The encoded test data is communicated via multiple wires connecting the main IC chip with the auxiliary IC chip. Further, the non-encoded test data is communicated via respective wires connecting the main IC chip with the auxiliary IC chip. Communicating encoded data reduces the number of wires used to connect the main IC chip with the auxiliary IC chip, reducing the cost of the corresponding device.

While the foregoing is directed to specific examples, other and further examples may be devised without departing from the basic scope thereof, and the scope thereof is determined by the claims that follow.

What is claimed is:

1. An integrated circuit (IC) chip device comprising:
   a first IC chip comprising:
   first testing circuitry configured to receive a mode select signal, a clock signal, and encoded signals, the first testing circuitry comprising:
   finite state machine (FSM) circuitry configured to determine an instruction based on the mode select signal and the clock signal;
   decoder circuitry configured to decode the encoded signals to generate a decoded signal; and
   control circuitry configured to generate a control signal from the instruction and the decoded signal, wherein the control signal indicates a test to be performed by the first testing circuitry.

2. The IC chip device of claim 1, wherein the encoded signals include a first encoded instruction signal, a second encoded instruction signal, and a third encoded instruction signal.

3. The IC chip device of claim 2, wherein the first encoded instruction signal, the second encoded instruction signal, and the third encoded instruction signal are binary signals.

4. The IC chip device of claim 2, wherein the mode select signal is received via a first wire, the clock signal is received via a second wire, the first encoded instruction signal is received via a third wire, the second encoded instruction signal is received via a fourth wire, and the third encoded instruction signal is received via a fifth wire.

5. The IC chip device of claim 1, further comprising a second IC chip configured to receive the mode select signal, the clock signal, and a test data signal, the second IC chip comprising:
   a first test access port (TAP) controller comprising encoder circuitry, wherein the encoder circuitry is configured to generate the encoded signals from the test data signal, the second IC chip is further configured to communicate the mode select signal, the clock signal, and the encoded signals to the first IC chip.

6. The IC chip device of claim 5, wherein the second IC chip further comprises second testing circuitry, the second testing circuitry configured to receive the mode select signal, the clock signal, and the encoded signals from the first TAP controller, and decode the encoded signals.

7. The IC chip device of claim 5, wherein the first IC chip further comprises a second TAP controller configured to receive the mode select signal, the clock signal, and the encoded signals from the first TAP controller, and communicate the mode select signal, the clock signal, and the encoded signals to the first testing circuitry.

8. The IC chip device of claim 5, wherein the second IC chip further comprises an auxiliary detect circuitry configured to:
   receive a control signal;
   determine that the first IC chip is connected to the second IC chip based on the control signal; and
   output the mode select signal, the clock signal, and the encoded signals to the first IC chip based on the determination that the first IC chip is connected to the second IC chip.

9. A multiple integrated circuit (IC) chip device comprising:
   a first IC chip configured to receive a mode select signal, a clock signal, and a test data signal, and comprising:
   a first test access port (TAP) controller comprising encoder circuitry configured to generate encoded signals from the test data signal; and
   a second IC chip comprising:
   first testing circuitry configured to:
   receive the mode select signal, the clock signal, and the encoded signals;
   decode the encoded signals to generate a decoded signal;
   determine an instruction based on the mode select signal and the clock signal; and
   generate a control signal indicative of a test to be performed by the first testing circuitry.

10. The multiple IC chip device of claim 9, wherein the first testing circuitry comprises:
    finite state machine (FSM) circuitry configured to determine the instruction based on the mode select signal and the clock signal;
    TAP decoder circuitry configured to decode the encoded signals to generate the decoded signal; and
    control circuitry configured to generate the control signal from the instruction and the decoded signal.

11. The multiple IC chip device of claim 9, wherein the encoded signals include a first encoded instruction signal, a second encoded instruction signal, and a third encoded instruction signal, and wherein the first encoded instruction signal, the second encoded instruction signal, and the third encoded instruction signal are binary signals.

12. The multiple IC chip device of claim 11, wherein a first wire, a second wire, a third wire, a fourth wire, and a fifth wire connects the first IC chip with the second IC chip, and wherein the mode select signal is received via the first wire, the clock signal is received via the second wire, the first encoded instruction signal is received via the third wire, the second encoded instruction signal is received via the fourth wire, and the third encoded instruction signal is received via the fifth wire.

13. The multiple IC chip device of claim 9, wherein the first IC chip further comprises second testing circuitry configured to receive the mode select signal, the clock signal, and the encoded signals from the first TAP controller, and decode the encoded signals, and wherein the second IC chip further comprises a second TAP controller configured to receive the mode select signal, the clock signal, and the encoded signals from the first TAP controller, and communicate the mode select signal, the clock signal, and the encoded signals to the first testing circuitry.

14. The multiple IC chip device of claim 9, wherein the first IC chip further comprises an auxiliary detect circuitry configured to:
    receive a control signal;
    determine that the second IC chip is connected to the first IC chip based on the control signal; and
    output the mode select signal, the clock signal, and the encoded signals to the second IC chip based on the determination that the second IC chip is connected to the first IC chip.

15. A method comprising:
    receiving, at a first integrated circuit (IC) chip, a mode select signal, a clock signal, and encoded signals;
    determining, via finite state machine (FSM) circuitry of the first IC chip, an instruction based on the mode select signal and the clock signal;
    decoding, via test access port (TAP) decoder circuitry, the encoded signals to generate a decoded signal;
    generating a control signal from the instruction and the decoded signal; and performing a test within the first IC chip based on the control signal.

16. The method of claim 15, wherein the encoded signals include a first encoded instruction signal, a second encoded instruction signal, and a third encoded instruction signal, and wherein the first encoded instruction signal, the second encoded instruction signal, and the third encoded instruction signal are binary signals.

17. The method of claim 16, wherein the mode select signal is received via a first wire, the clock signal is received via a second wire, the first encoded instruction signal is received via a third wire, the second encoded instruction signal is received via a fourth wire, and the third encoded instruction signal is received via a fifth wire.

18. The method of claim 15 further comprising:
receiving, at a second IC chip, the mode select signal, the clock signal, and a test data signal;
encoding, via encoder circuitry of the second IC chip, the test data signal to generate the encoded signals; and
communicating the mode select signal, the clock signal, and the encoded signals to the first IC chip from the second IC chip.

19. The method of claim 18, further comprising receiving, via second testing circuitry of the second IC chip, the mode select signal, the clock signal, and the encoded signals, and decoding the encoded signals to generate a second decoded signal.

20. The method of claim 18 further comprising:
receiving, at auxiliary detect circuitry of the second IC chip, a control signal;
determining, by the auxiliary detect circuitry, that the first IC chip is connected to the second IC chip based on the control signal; and
outputting the mode select signal, the clock signal, and the encoded signals to the first IC chip based on the determination that the first IC chip is connected to the second IC chip.

* * * * *